(12) United States Patent
Chang et al.

(10) Patent No.: US 6,642,769 B1
(45) Date of Patent: Nov. 4, 2003

(54) HIGH SPEED VOLTAGE LEVEL SHIFTER WITH A LOW INPUT VOLTAGE

(75) Inventors: Hung-yi Chang, Hsinchu (TW); Yi-hwa Chang, Hsinchu (TW)

(73) Assignee: Faraday Technology Corporation (TW)

(*) Notice: Subject to any disclaimer, the term of this patent is extended or adjusted under 35 U.S.C. 154(b) by 0 days.

(21) Appl. No.: 10/202,036

(22) Filed: Jul. 23, 2002

(51) Int. Cl.[7] ............................................. H03L 5/00
(52) U.S. Cl. ............................ 327/333; 326/68; 326/80
(58) Field of Search ................................ 327/333, 374, 327/63, 68, 80, 83; 326/60, 63, 68, 80, 83, 81

(56) References Cited

U.S. PATENT DOCUMENTS

| | | | | |
|---|---|---|---|---|
| 5,969,542 A | * | 10/1999 | Maley et al. | 326/81 |
| 6,111,429 A | * | 8/2000 | Bertolini | 326/68 |
| 6,487,687 B1 | * | 11/2002 | Blake et al. | 717/124 |

* cited by examiner

Primary Examiner—Tuan T. Lam
Assistant Examiner—Hiep Nguyen
(74) Attorney, Agent, or Firm—Martine & Penilla, LLP

(57) ABSTRACT

An input terminal of a voltage level shifter controls gates of thin oxide N-type MOS transistors with a relatively low threshold voltage. Consequently, the thin oxide N-type MOS transistor is still sufficiently turned on even when the input voltage is very low such that the voltage level shifter according to the present invention operates at high speed without distortion of the waveform of an output voltage. In order to protect the thin oxide N-type transistors, thick oxide N-type MOS transistors with gates controlled by a reference voltage level and thin oxide N-type MOS transistors with gates controlled by a relatively low voltage level are connected in series to drains of the thin oxide N-type MOS transistors to be protected. The reference voltage level is larger than the threshold voltage of the thick oxide N-type MOS transistor and equal to or smaller than a sum of twice of the relatively low voltage level and the threshold voltage of the thick oxide N-type MOS transistor.

14 Claims, 4 Drawing Sheets

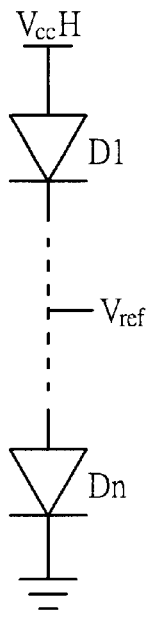 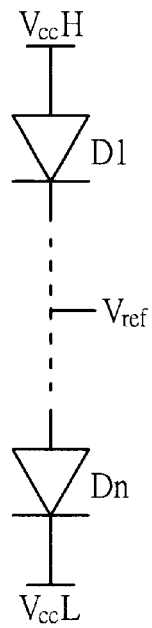 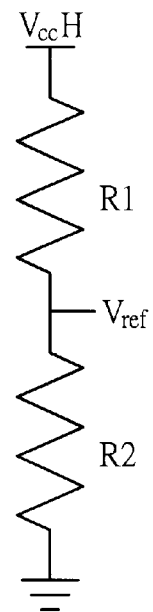
Fig. 5(a)　　Fig. 5(b)　　Fig. 5(c)
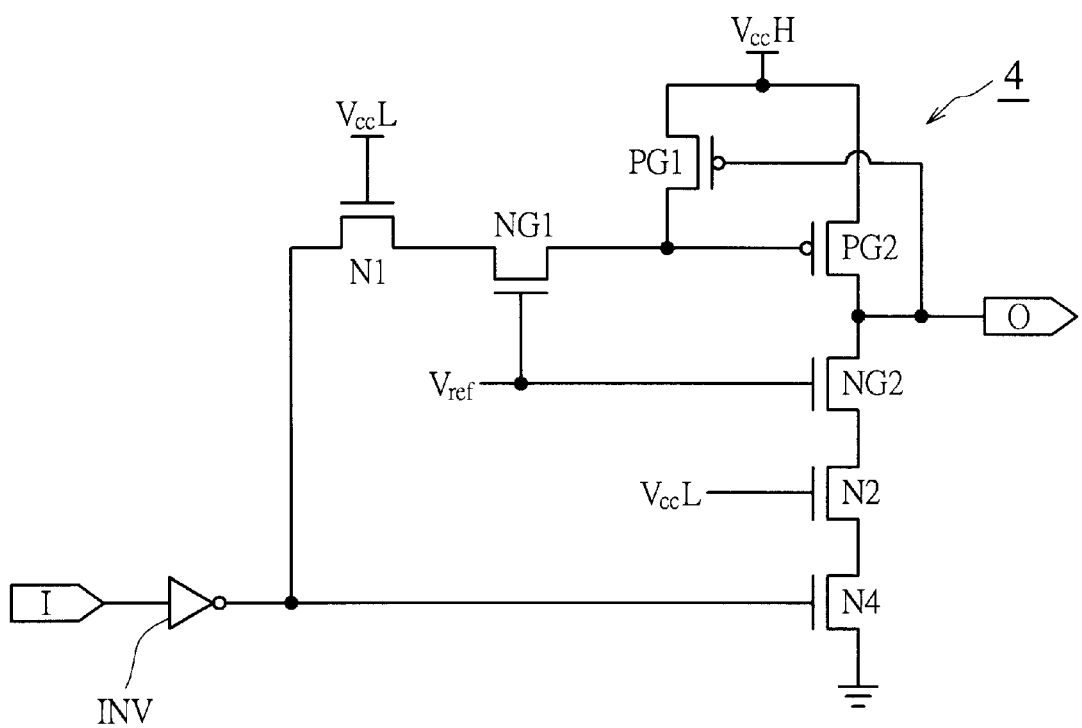
Fig. 6

HIGH SPEED VOLTAGE LEVEL SHIFTER WITH A LOW INPUT VOLTAGE

BACKGROUND OF THE INVENTION

1. Field of the Invention

The present invention relates to a voltage level shifter and, more particularly, to a voltage level shifter capable of operating at high speed without distortion of the waveform of an output voltage even when an input voltage is very low.

2. Description of the Related Art

Modern integrated circuit systems generally employ two different levels of power supply voltages for core logic units and input/output units of the integrated circuit systems, respectively. Take the 0.13 µm process as an example, the core logic unit is typically applied with a power supply voltage with a level of 1.2 volts while the input/output unit is typically applied with a power supply voltage with a level of 3.3 volts. Due to a difference between operation voltages, there are typically two kinds of transistors that are different in a thickness of a gate oxide layer from each other, i.e. thin oxide transistors and thick oxide transistors, used in the integrated circuit system. In general, the thin oxide transistor is utilized within the core logic unit while thick oxide transistor is utilized within the input/output unit. Consequently, it is necessary for the integrated circuit system to use a voltage level shifter as an interface device between the core logic unit and the input/output unit, thereby performing a function of mapping a voltage range applicable to operations of the core logic unit into a voltage range applicable to operations of the input/output unit.

FIG. 1(a) is a circuit configuration diagram showing a conventional voltage level shifter 1. Referring to FIG. 1(a), the conventional voltage level shifter 1 includes a first and second P-type MOS transistors PG1 and PG2, a first and second N-type MOS transistors NG1 and NG2, and an inverter INV. Each of the first and second P-type MOS transistors PG1 and PG2 and each of the first and second N-type MOS transistors NG1 and NG2 are both a thick oxide MOS transistor having a gate oxide layer with a thickness of about 65 angstroms.

A gate electrode of the first P-type MOS transistor PG1 is electrically connected to an output terminal O of the voltage level shifter 1 and a source electrode thereof is electrically connected to a first voltage level VccH. A gate electrode of the second P-type transistor PG2 is electrically connected to a drain electrode of the first P-type MOS transistor PG1, a drain electrode thereof is electrically connected to the output terminal 0 of the voltage level shifter 1, and a source electrode thereof is electrically connected to the first voltage level VccH. For example, the first voltage level VccH is 3.3 volts. A gate of the first N-type MOS transistor NG1 is used as an input terminal I of the voltage level shifter 1, a source electrode thereof is grounded, and a drain electrode thereof is electrically connected to the drain electrode of the first P-type MOS transistor PG1. A source electrode of the second N-type MOS transistor NG2 is grounded and a drain electrode thereof is electrically connected to the drain electrode of the second P-type MOS transistor PG2. An input node of the inverter INV is electrically connected to the input terminal I of the voltage level shifter 1 and an output terminal thereof is electrically connected to a gate electrode of the second N-type MOS transistor NG2.

FIG. 1(b) is a circuit configuration diagram showing another conventional voltage level shifter 2. Although the voltage level shifters 1 and 2 shown in FIGS. 1(a) and 1(b) are different in the circuit configuration from each other, their relationships of input voltages versus output voltages are substantially the same. In the following, the relationship between the input voltage and the output voltage of the conventional voltage level shifter will be described in detail with reference to FIG. 2.

FIG. 2 is a timing chart showing numerical simulations of waveforms of an input voltage and an output voltage of the conventional voltage level shifter 1 or 2 shown in FIG. 1(a) or 1(b). Referring to FIG. 2, when a rectangular wave with a voltage range from 0 to 1.0 volt is used as an input voltage, the conventional voltage level shifter 1 or 2 raises the maximum level of an output voltage up to about 3.3 volts, i.e. the first voltage level VccH. However, it is clearly found from FIG. 2 that the conventional voltage level shifter 1 or 2 has a problem that the waveform of the output voltage is seriously distorted and therefore no longer remains as a rectangular wave. This is because the input voltage as low as 1.0 volt cannot sufficiently turn on the first and second N-type MOS transistors NG1 and NG2 since each of them belongs to a thick oxide transistor with a threshold voltage of about 0.8 volts. Moreover, as shown in FIG. 2, a time delay Tr occurs between the rising edge of the output voltage and the rising edge of the input voltage while a time delay Tf occurs between the falling edge of the output voltage and the falling edge of the input voltage. These rising and falling time delays Tr and Tf result in impossibility of high-speed operations of the conventional voltage level shifter 1 or 2.

SUMMARY OF THE INVENTION

In view of the above-mentioned problems, an object of the present invention is to provide a voltage level shifter capable of preventing the output voltage from distortion even when the input voltage level is very low.

Another object of the present invention is to provide a voltage level shifter capable of operating at high speed even when the input voltage is very low.

According to one aspect of the present invention, a high speed voltage level shifter with a low input voltage includes a first and second thick oxide P-type MOS transistors, a first and second thick oxide N-type MOS transistors, a first and second thin oxide N-type MOS transistors, a third and fourth thin oxide N-type MOS transistors, and an inverter. Source electrodes of the first and second thick oxide P-type MOS transistors are electrically connected to a high voltage level. For example, the high voltage level is a power supply voltage applied to an input/output unit in an integrated circuit system and is about 3.3 volts. Gate electrodes of the first and second thick oxide N-type MOS transistors are electrically connected to a reference voltage level. For example, the reference voltage level is provided from a voltage divider. Gate electrodes of the first and second thin oxide N-type MOS transistors are electrically connected to a low voltage level. For example, the low voltage level is a power supply voltage applied to a core logic unit in the integrated circuit system and is about 1.2 volts.

The input voltage is coupled to a gate of the third thin oxide N-type MOS transistor and, through the inverter, to a gate of the fourth thin oxide N-type MOS transistor. When the input voltage is very low, the third and fourth thin oxide N-type MOS transistors are sufficiently turned on since their threshold voltage is relatively low.

It is necessary for the reference voltage level according to the present invention to be larger than a threshold voltage of the first thick oxide N-type MOS transistor and simultaneously to be equal to or smaller than a sum of twice of the low voltage level and the threshold voltage of the first thick oxide N-type MOS transistor, thereby protecting the third and fourth thin oxide N-type MOS transistors from damage caused by the high voltage level.

According to another aspect of the invention, a high speed voltage level shifter with a low input voltage is provided to be different from the above-mentioned high speed voltage level shifter in that the third thin oxide N-type MOS transistor is deleted and an output node of the inverter is electrically connected to, besides the gate electrode of the fourth thin oxide N-type MOS transistor, a drain electrode of the first thin oxide N-type MOS transistor.

BRIEF DESCRIPTION OF THE DRAWINGS

The above-mentioned and other objects, features, and advantages of the present invention will become apparent with reference to the following descriptions and accompanying drawings, wherein:

FIGS. 5(a) to 5(c) are circuit configuration diagrams showing a variety of voltage dividers for applying a reference voltage in a high speed voltage level shifter with a low input voltage according to the present invention, respectively; and FIG. 6 is a circuit configuration diagram showing a high speed voltage level shifter with a low input voltage according to another embodiment of the present invention.

DETAILED DESCRIPTION OF THE PREFERRED EMBODIMENTS

The preferred embodiments according to the present invention will be described in detail with reference to the drawings.

Figure 1A:
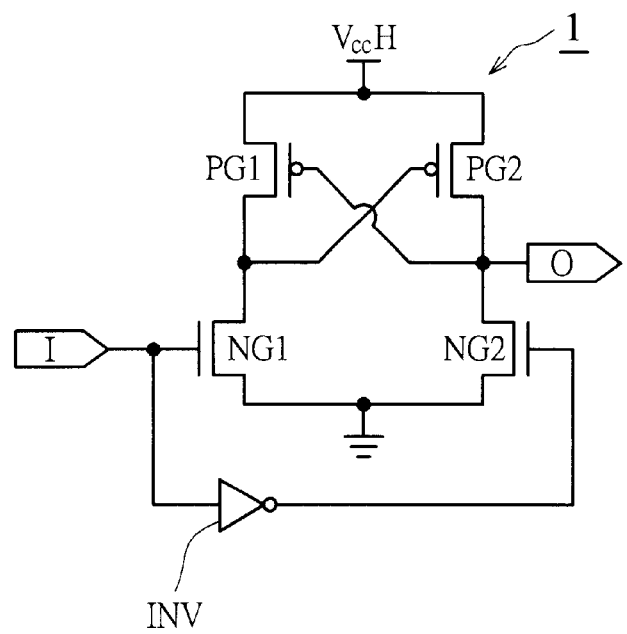
FIG. 1(a) is a circuit configuration diagram showing a conventional voltage level shifter.
Figure 1B:
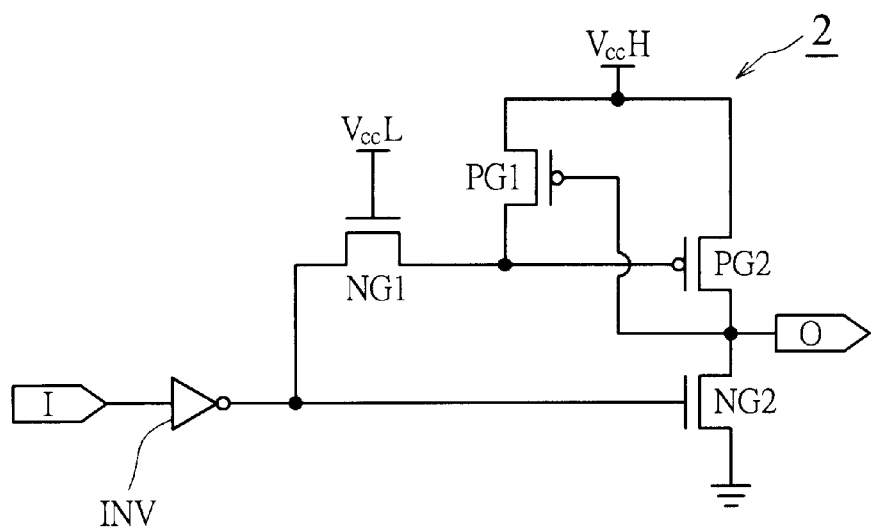
FIG. 1(b) is a circuit configuration diagram showing another conventional voltage level shifter.
Figure 2:
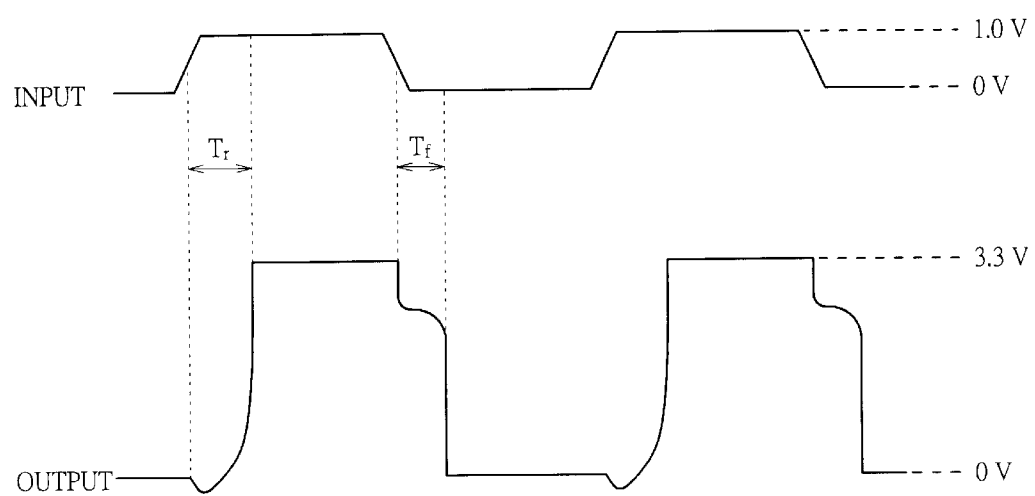
FIG. 2 is a timing chart showing numerical simulations of waveforms of an input voltage and an output voltage of the conventional voltage level shifter shown in FIG. 1(a) or 1(b)
Figure 3:
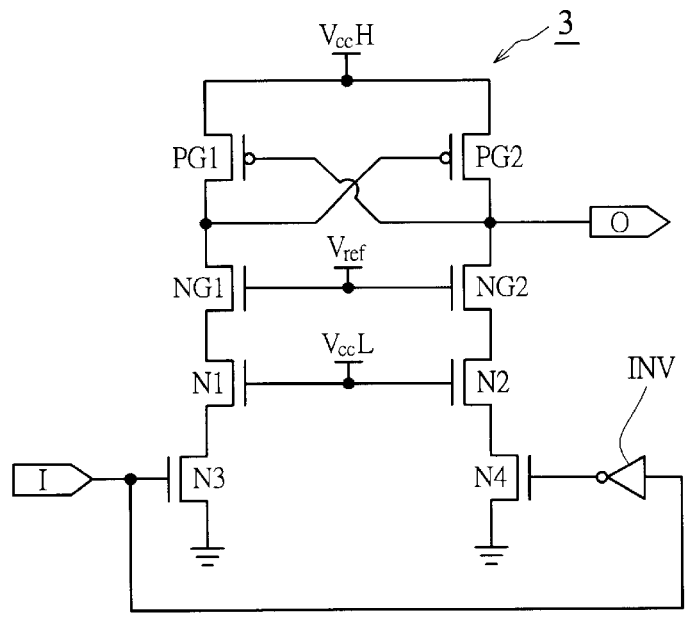
FIG. 3 is a circuit configuration diagram showing a high speed voltage level shifter with a low input voltage according to one embodiment of the present invention.

FIG. 3 is a circuit configuration diagram showing a high speed voltage level shifter 3 with a low input voltage according to one embodiment of the present invention. Referring to FIG. 3, the high speed voltage level shifter 3 with a low input voltage according to the present invention includes a first and second thick oxide P-type MOS transistors PG1 and PG2 with substantially identical electrical and physical characteristics, a first and second thick oxide N-type MOS transistors NG1 and NG2 with substantially identical electrical and physical characteristics, a first and second thin oxide N-type MOS transistors N1 and N2 with substantially identical electrical and physical characteristics, a third and fourth thin oxide N-type MOS transistors N3 and N4 with substantially identical electrical and physical characteristics, and an inverter INV.

A gate electrode of the first thick oxide P-type MOS transistor PG1 is electrically connected to an output terminal O of the high speed voltage level shifter 3 according to the present invention. A source electrode of the first thick oxide P-type MOS transistor PG1 is electrically connected to a high voltage level VccH. For example, the high voltage level VccH is a power supply voltage applied to an input/output unit in an integrated circuit system and is about 3.3 volts. A gate, drain, and source electrodes of the second thick oxide P-type MOS transistor are electrically connected to a drain electrode of the first thick oxide P-type MOS transistor PG1, the output terminal O, and the high voltage level VccH, respectively.

A gate and drain electrodes of the first thick oxide N-type MOS transistor NG1 are electrically connected to a reference voltage level Vref and the drain of the first thick oxide P-type MOS transistor PG1, respectively. A gate and drain electrodes of the second thick oxide N-type transistor NG2 are electrically connected to the reference voltage level Vref and the output terminal O. A gate and drain electrodes of the first thin oxide N-type MOS transistor N1 are electrically connected to a low voltage level VccL and a source electrode of the first thick oxide N-type MOS transistor NG1, respectively. The value of the low voltage level VccL is lower than the value of the high voltage level VccH. For example, the low voltage level VccL is a power supply voltage applied to a core logic unit in the integrated circuit system and is about 1.2 volts. A gate and drain electrodes of the second thin oxide N-type MOS transistor NG2 is electrically connected to the low voltage level VccL and a source electrode of the second thick oxide N-type MOS transistor NG2. A gate electrode of the third thin oxide N-type MOS transistor N3 is used as an input terminal I of the high speed voltage level shifter 3 according to the present invention. A source electrode of the third thin oxide N-type MOS transistor N3 is grounded and a drain electrode thereof is electrically connected to a source electrode of the first thin oxide N-type MOS transistor N1. A source electrode of the fourth thin oxide N-type MOS transistor N4 is grounded and a drain electrode thereof is electrically connected to a source electrode of the second thin oxide N-type MOS transistor N2. An input node of the inverter INV is electrically connected to the input terminal I and an output node thereof is electrically connected to a gate electrode of the fourth thin oxide N-type MOS transistor N4.

In the present invention, each of the thick oxide N-type MOS transistors has a gate oxide layer with a thickness larger than that of each of the thin oxide N-type MOS transistors. For example, the gate oxide layer of the thick oxide N-type MOS transistor has a thickness of about 65 angstroms. In addition, each of the thick oxide N-type MOS transistors has a threshold voltage larger than that of each of the thin oxide N-type MOS transistors. For example, the threshold voltage of the thick oxide N-type MOS transistor is about 0.8 volts while the threshold voltage of the thin oxide N-type MOS transistor is about 0.4 volts. The high speed voltage level shifter 3 according to the present invention substitutes the thick oxide N-type MOS transistors in the conventional voltage level shifter with the third and fourth thin oxide N-type MOS transistors N3 and N4 such that the input terminal I is coupled to the gate electrode of the third thin oxide N-type MOS transistor N3 and, through the inverter INV, to the gate electrode of the fourth thin oxide N-type MOS transistor N4. As a result, even when the input voltage is as low as 1.0 volt, the third and fourth thin oxide N-type MOS transistors N3 and N4 are sufficiently turned on because their threshold voltage is relatively low.

Figure 4:
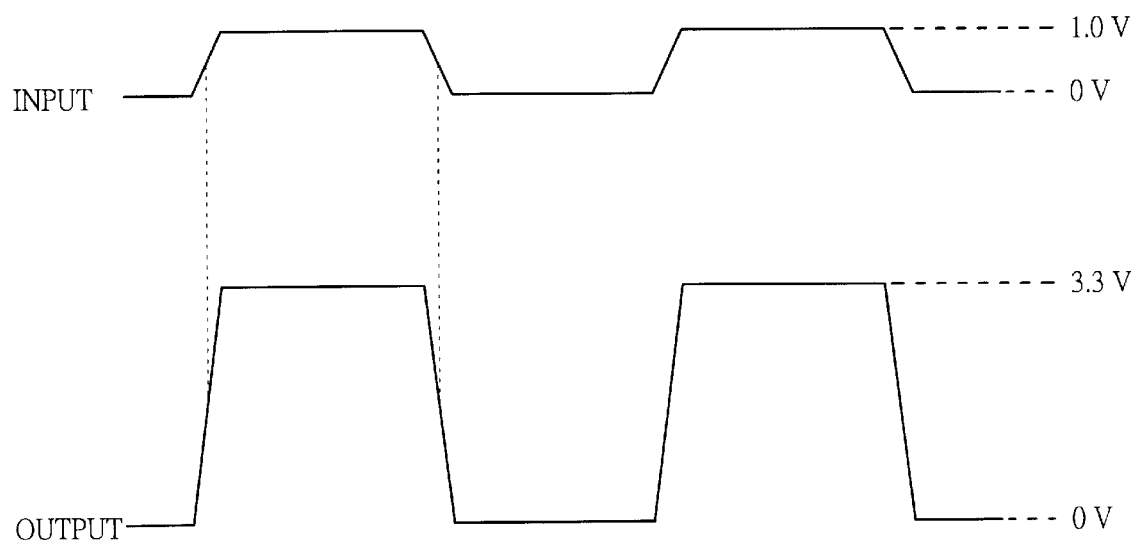
FIG. 4 is a timing chart showing numerical simulations of waveforms of an input voltage and an output voltage of the high speed voltage level shifter shown in FIG. 3.

FIG. 4 is a timing chart showing numerical simulations of waveforms of an input voltage and an output voltage of the high speed voltage level shifter 3 shown in FIG. 3. Referring to FIG. 4, when a rectangular wave with a voltage range from 0 to 1.0 volt is used as an input voltage, the voltage level shifter 3 according to the present invention raises the maximum level of an output voltage up to about 3.3 volts, i.e. the high voltage VccH. It is sufficient for the input voltage as low as 1.0 volt to turn on the third and fourth thin oxide N-type MOS transistors N3 and N4 because both of them have a relatively low threshold voltage. Therefore, the voltage level shifter 3 according to the present invention outputs a voltage waveform without distortion and operates at high speed without any rising and falling time delays Tr and Tf even when the input voltage is very low.

Referring to FIG. 3 again, the circuit combination of the first and second thick oxide N-type MOS transistors NG1 and NG2 as well as the first and second thin oxide N-type MOS transistors N1 and N2 is adopted to protect the third and fourth thin oxide N-type MOS transistors N3 and N4 from damage caused by the high voltage level VccH. In order to achieve this object, it is necessary for the reference voltage level Vref according to the present invention to be larger than a threshold voltage of the first thick oxide N-type MOS transistor NG1 to ensure that the first and second thick oxide N-type MOS transistors NG1 and NG2 are turned on. Also, the reference voltage level Vref must be equal to or smaller than a sum of twice of the low voltage level VccL and the threshold voltage of the first thick oxide N-type MOS transistor NG1 such that a voltage equal to or smaller than twice of the low voltage level VccL is applied to the drain electrode of each of the first and second thin oxide N-type MOS transistors N1 and N2.

FIG. 5(a) is a circuit configuration diagram showing a first example of the voltage divider for applying the reference voltage in the high speed voltage level shifter with a low input voltage according to the present invention. Referring to FIG. 5(a), the voltage divider for applying the reference voltage consists of a plurality of diodes D1 to Dn connected in series between the high voltage level VccH and ground. The reference voltage level Vref may be extracted from an appropriate node of the voltage divider as shown in FIG. 5(a).

FIG. 5(b) is a circuit configuration diagram showing a second example of the voltage divider for applying the reference voltage in the high speed voltage level shifter with a low input voltage according to the present invention. Referring to FIG. 5(b), the voltage divider for applying the reference voltage consists of a plurality of diodes D1 to Dn connected in series between the high voltage level VccH and low voltage level VccL. The reference voltage level Vref may be extracted from an appropriate node of the voltage divider as shown in FIG. 5(b).

It should be noted that, in each of the voltage dividers shown in FIGS. 5(a) and 5(b), each of the diodes D1 to Dn may be provided by either an N-type MOS transistor with a gate and drain electrodes coupled together or a P-type MOS transistor with a gate and drain electrodes coupled together.

FIG. 5(c) is a circuit configuration diagram showing a third example of the voltage divider for applying the reference voltage in the high speed voltage level shifter with a low input voltage according to the present invention. Referring to FIG. 5(c), the voltage divider for applying the reference voltage consists of high-resistance resistors R1 and R2 connected in series between the high voltage level VccH and ground. The reference voltage level Vref may be extracted from the connection node between the resistors R1 and R2 of the voltage divider as shown in FIG. 5(b).

FIG. 6 is a circuit configuration diagram showing a high speed voltage level shifter 4 with a low input voltage according to another embodiment of the present invention. In FIG. 6, the similar components of the voltage level shifter 4 to those of the voltage level shifter 3 are denoted with the same reference numerals. For the sake of simplicity, only is the difference of the embodiment shown in FIG. 6 from that shown in FIG. 3 described in detail.

Referring to FIG. 6, the high speed voltage level shifter 4 with a low input voltage according to the present invention includes a first and second thick oxide P-type MOS transistors PG1 and PG2 with substantially identical electrical and physical characteristics, a first and second thick oxide N-type MOS transistors NG1 and NG2 with substantially identical electrical and physical characteristics, a first and second thin oxide N-type MOS transistors N1 and N2 with substantially identical electrical and physical characteristics, a fourth thin oxide N-type MOS transistor N4, and an inverter INV.

The voltage level shifter 4 shown in FIG. 6 is different from the voltage level shifter 3 shown in FIG. 3 in that the third thin oxide N-type MOS transistor N3 is deleted from the former and the output node of the inverter of the former is electrically connected to the source electrode of the first thin oxide N-type MOS transistor N1 in addition to the gate electrode of the fourth thin oxide N-type MOS transistor N4.

In the voltage level shifter 4 shown in FIG. 6, the circuit combination of the first and second thick oxide N-type MOS transistors NG1 and NG2 as well as the second thin oxide N-type MOS transistor N2 is adopted to protect the first and fourth thin oxide N-type MOS transistors N1 and N4 from damage caused by the high voltage level VccH. In order to achieve this object, it is necessary for the reference voltage level Vref according to the present invention to be larger than a threshold voltage of the first thick oxide N-type MOS transistor NG1 to ensure that the first and second thick oxide N-type MOS transistors NG1 and NG2 are turned on. Also, the reference voltage level Vref must be equal to or smaller than a sum of twice of the low voltage level VccL and the threshold voltage of the first thick oxide N-type MOS transistor NG1 such that a voltage equal to or smaller than twice of the low voltage level VccL is applied to the drain electrode of each of the first and second thin oxide N-type MOS transistors N1 and N2.

Similarly to the voltage level shifter 3 shown in FIG. 3, the reference voltage level Vref in the voltage level shifter 4 shown in FIG. 6 may also be provided from any of the voltage dividers shown in FIGS. 5(a) to 5(c).

While the invention has been described by way of examples and in terms of preferred embodiments, it is to be understood that the invention is not limited to the disclosed embodiments. To the contrary, it is intended to cover various modifications. Therefore, the scope of the appended claims should be accorded the broadest interpretation so as to encompass all such modifications.

What is claimed is:

1. A high speed voltage level shifter with a low input voltage comprising:
   a first P-type MOS transistor with a gate electrode electrically connected to an output terminal and a source electrode electrically connected to a first voltage level;
   a second P-type MOS transistor with a gate electrode electrically connected to a drain electrode of the first P-type MOS transistor, a drain electrode used as the output terminal, and a source electrode electrically connected to the first voltage level;
   a first N-type MOS transistor with a gate electrode electrically connected to a reference voltage level and a drain electrode electrically connected to the drain electrode of the first P-type MOS transistor;
   a second N-type MOS transistor with a gate electrode electrically connected to the reference voltage level and a drain electrode electrically connected to the output terminal;

a third N-type MOS transistor with a gate electrode electrically connected to a second voltage level and a drain electrode electrically connected to a source electrode of the first N-type MOS transistor;

a fourth N-type MOS transistor with a gate electrode electrically connected to the second voltage level and a drain electrode electrically connected to a source electrode of the second N-type MOS transistor;

a fifth N-type MOS transistor with a gate electrode used as an input terminal, a source electrode grounded, and a drain electrode electrically connected to a source electrode of the third N-type MOS transistor;

a sixth N-type MOS transistor with a source electrode grounded and a drain electrode electrically connected to a source electrode of the fourth N-type MOS transistor; and an inverter with an input node electrically connected to the input terminal and an output node electrically connected to a gate electrode of the sixth N-type MOS transistor, wherein:

the first voltage level is higher than the second voltage level;

the reference voltage level is larger than a threshold voltage of the first N-type MOS transistor and equal to or smaller than a sum of twice of the second voltage level and the threshold voltage of the first N-type MOS transistor;

each of the first and second N-type MOS- transistors has an gate oxide layer with a thickness larger than that of an gate oxide layer of each of the third, fourth, fifth, and sixth N-type MOS transistors; and each of the first and second N-type MOS transistors has a threshold voltage larger than that of each of the third, fourth, fifth, and sixth N-type MOS transistors.

2. The high speed voltage level shifter with a low input voltage according to claim 1, wherein the reference voltage level is provided from a voltage divider.

3. The high speed voltage level shifter with a low input voltage according to claim 2, wherein the voltage divider consists of a plurality of diodes electrically connected in series between the first voltage level and ground.

4. The high speed voltage level shifter with a low input voltage according to claim 2, wherein the voltage divider consists of a plurality of diodes electrically connected in series between the first voltage level and second voltage level.

5. The high speed voltage level shifter with a low input voltage according to claim 2, wherein the voltage divider consists of a plurality of resistors electrically connected in series between the first voltage level and ground.

6. The high speed voltage level shifter with a low input voltage according to claim 3 or 4, wherein each of the plurality of diodes is provided by an N-type MOS transistor with a gate and drain electrodes coupled together.

7. The high speed voltage level shifter with a low input voltage according to claim 3 or 4, wherein each of the plurality of diodes is provided by a P-type MOS transistor with a gate and drain electrodes coupled together.

8. A high speed voltage level shifter with a low input voltage comprising:

a first P-type MOS transistor with a gate electrode electrically connected to an output terminal and a source electrode electrically connected to a first voltage level;

a second P-type MOS transistor with a gate electrode electrically connected to a drain electrode of the first P-type MOS transistor, a drain electrode used as the output terminal, and a source electrode electrically connected to the first voltage level;

a first N-type MOS transistor with a gate electrode electrically connected to a reference voltage level and a drain electrode electrically connected to the drain electrode of the first P-type MOS transistor;

a second N-type MOS transistor with a gate electrode electrically connected to the reference voltage level and a drain electrode electrically connected to the output terminal;

a third N-type MOS transistor with a gate electrode electrically connected to a second voltage level and a drain electrode electrically connected to a source electrode of the first N-type MOS transistor;

a fourth N-type MOS transistor with a gate electrode electrically connected to the second voltage level and a drain electrode electrically connected to a source electrode of the second N-type MOS transistor;

a fifth N-type MOS transistor with a source electrode grounded and a drain electrode electrically connected to a source electrode of the fourth N-type MOS transistor; and an inverter with an input node electrically used as an input terminal and an output node electrically connected to a source electrode of the third N-type MOS transistor and a gate electrode of the fifth N-type MOS transistor, wherein:

the first voltage level is higher than the second voltage level;

the reference voltage level is larger than a threshold voltage of the first N-type MOS transistor and equal to or smaller than a sum of twice of the second voltage level and the threshold voltage of the first N-type MOS transistor;

each of the first and second N-type MOS transistors has an gate oxide layer with a thickness larger than that of an gate oxide layer of each of the third, fourth, and fifth N-type MOS transistors; and each of the first and second N-type MOS transistors has a threshold voltage larger than that of each of the third, fourth, and fifth N-type MOS transistors.

9. The high speed voltage level shifter with a low input voltage according to claim 8, wherein the reference voltage level is provided from a voltage divider.

10. The high speed voltage level shifter with a low input voltage according to claim 9, wherein the voltage divider consists of a plurality of diodes electrically connected in series between the first voltage level and ground.

11. The high speed voltage level shifter with a low input voltage according to claim 9, wherein the voltage divider consists of a plurality of diodes electrically connected in series between the first voltage level and second voltage level.

12. The high speed voltage level shifter with a low input voltage according to claim 9, wherein the voltage divider consists of a plurality of resistors electrically connected in series between the first voltage level and ground.

13. The high speed voltage level shifter with a low input voltage according to claim 10 or 11, wherein each of the plurality of diodes is provided by an N-type MOS transistor with a gate and drain electrodes coupled together.

14. The high speed voltage level shifter with a low input voltage according to claim 10 or 11, wherein each of the plurality of diodes is provided by a P-type MOS transistor with a gate and drain electrodes coupled together.

* * * * *